United States Patent
Ahlers et al.

(10) Patent No.: US 11,802,920 B2
(45) Date of Patent: *Oct. 31, 2023

(54) SAFETY GROUND WIRE MONITORING AND ALARM SYSTEMS

(71) Applicant: Paige Electric Company, LP, Mountainside, NJ (US)

(72) Inventors: Mark D. Ahlers, Columbus, NE (US); Julie M. Bushell, Middleburg, VA (US)

(73) Assignee: Paige Electric Company, L.P., Union, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/566,118

(22) Filed: Dec. 30, 2021

(65) Prior Publication Data

US 2022/0120825 A1    Apr. 21, 2022

Related U.S. Application Data

(63) Continuation of application No. 16/059,521, filed on Aug. 9, 2018, now Pat. No. 11,237,222.

(Continued)

(51) Int. Cl.
*G01R 31/58*    (2020.01)
*G01R 31/327*    (2006.01)
(Continued)

(52) U.S. Cl.
CPC ......... *G01R 31/58* (2020.01); *G01R 31/3274* (2013.01); *G08B 13/12* (2013.01);
(Continued)

(58) Field of Classification Search
CPC .......... G01R 31/025; G01R 31/3274; G08B 21/185; H02H 5/105
See application file for complete search history.

(56) References Cited

U.S. PATENT DOCUMENTS

| 6,803,860 | B1 | 10/2004 | Langner et al. |
| 7,880,612 | B2 | 2/2011 | Caswell |

(Continued)

FOREIGN PATENT DOCUMENTS

| CN | 202748892 U | * | 2/2013 |
| CN | 202748892 U | | 2/2013 |

(Continued)

OTHER PUBLICATIONS

"Installation Guide", circa 2015, From: http://www.paigeelectric.com/custom_asset_protection/grounding_installation_guide.html.

(Continued)

*Primary Examiner* — Quan Zhen Wang
*Assistant Examiner* — Mancil Littlejohn, Jr.
(74) *Attorney, Agent, or Firm* — Cook Alex Ltd.

(57) ABSTRACT

A system for monitoring the integrity of a plurality of ground conductors has a plurality of monitors, with a different monitor associated with each ground conductor. Each monitor includes a voltage sensor which monitors voltage on a closed circuit of the monitor. Upon the voltage sensor sensing an unexpected voltage, a transmitter of the monitor issues an "alarm" signal, which may be wireless (e.g., being sent using LoRaWAN protocol). The transmitter may issue other signals, including a periodic "heartbeat" signal to confirm continued operation of the monitor, and a "movement" signal to indicate movement of the monitor. The monitor may be GPS-enabled, in which case each signal may include the GPS coordinates of the monitor. The signals issued by the transmitter may ultimately be analyzed by an operator via a user interface platform, which may simultaneously display information regarding two or more of the plurality of monitors.

20 Claims, 9 Drawing Sheets

Related U.S. Application Data

(60) Provisional application No. 62/545,205, filed on Aug. 14, 2017.

(51) Int. Cl.
| | | |
|---|---|---|
| *H02H 5/10* | (2006.01) | |
| *G08B 21/18* | (2006.01) | |
| *G08B 25/10* | (2006.01) | |
| *G08B 13/12* | (2006.01) | |
| *G08B 25/00* | (2006.01) | |
| *G08B 25/04* | (2006.01) | |
| *G08B 25/14* | (2006.01) | |
| *G08B 29/06* | (2006.01) | |

(52) U.S. Cl.
CPC ......... *G08B 13/122* (2013.01); *G08B 21/185* (2013.01); *G08B 25/009* (2013.01); *G08B 25/04* (2013.01); *G08B 25/10* (2013.01); *G08B 25/14* (2013.01); *G08B 29/06* (2013.01); *H02H 5/105* (2013.01)

(56) References Cited

U.S. PATENT DOCUMENTS

| | | |
|---|---|---|
| 8,860,580 B1 | 10/2014 | Wong |
| 9,269,246 B2 | 2/2016 | DeSalle |
| 9,520,038 B2 | 12/2016 | DeSalle |
| 9,844,032 B2 | 12/2017 | Johnson et al. |
| 2002/0181178 A1* | 12/2002 | Ortiz .................... H02H 3/38 361/42 |
| 2006/0193262 A1 | 8/2006 | McSheffrey et al. |
| 2008/0122518 A1 | 5/2008 | Besser et al. |
| 2008/0186172 A1 | 8/2008 | Thompson |
| 2008/0315568 A1 | 12/2008 | Bergvall |
| 2010/0305987 A1 | 12/2010 | Correll et al. |
| 2010/0328072 A1 | 12/2010 | Price et al. |
| 2012/0170412 A1 | 7/2012 | Calhoun et al. |
| 2013/0335219 A1 | 12/2013 | Malkowski |
| 2015/0213706 A1* | 7/2015 | Bai .................... G08B 21/185 340/635 |
| 2016/0172827 A1 | 6/2016 | Batista Oliveira Costa Leal |
| 2017/0230074 A1 | 8/2017 | Rose et al. |

FOREIGN PATENT DOCUMENTS

| | | |
|---|---|---|
| GB | 2518472 A | 3/2015 |
| WO | WO 2015/008196 A2 | 1/2015 |

OTHER PUBLICATIONS

"Partnersnip Extends Senet's Reach into The Rapidly Growing IoT-Enabied Agriculture Solutions Market", Nov. 15, 2016, From: https://www.senetco.com/news/sentet-and-paige-ag-partner-to-deliver-smart-irrigation-solutions/.

PCT International Search Report and Written Opinion for PCT/US2018/045977 dated Nov. 29, 2018.

* cited by examiner

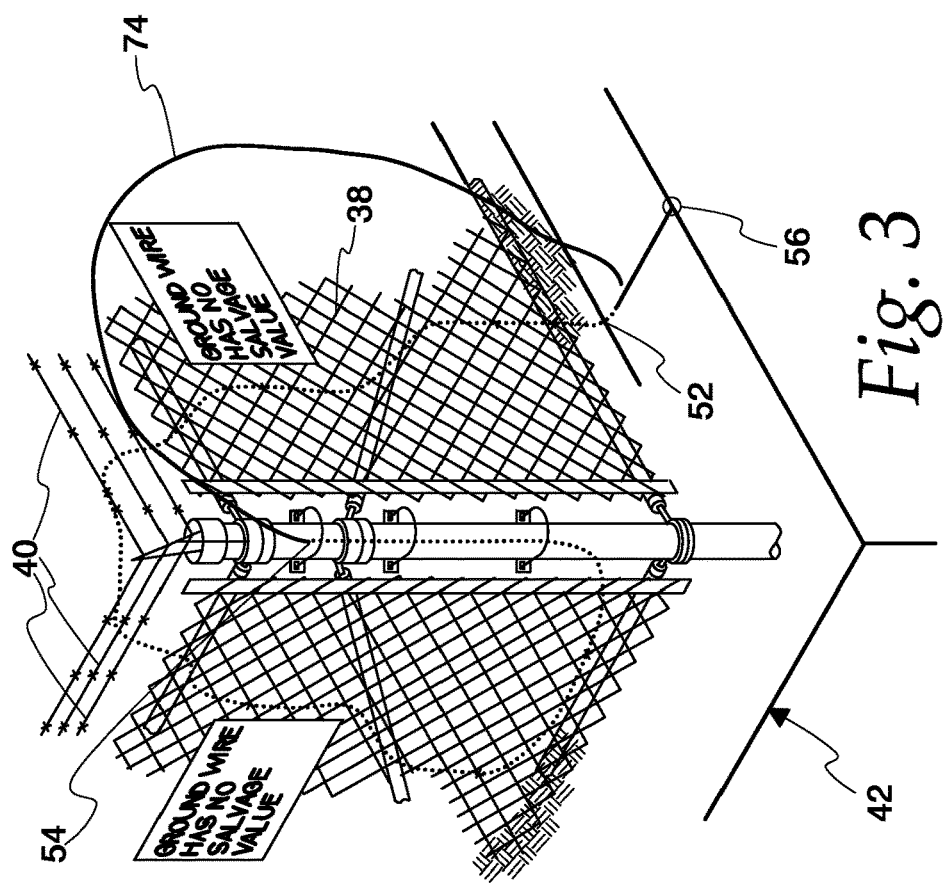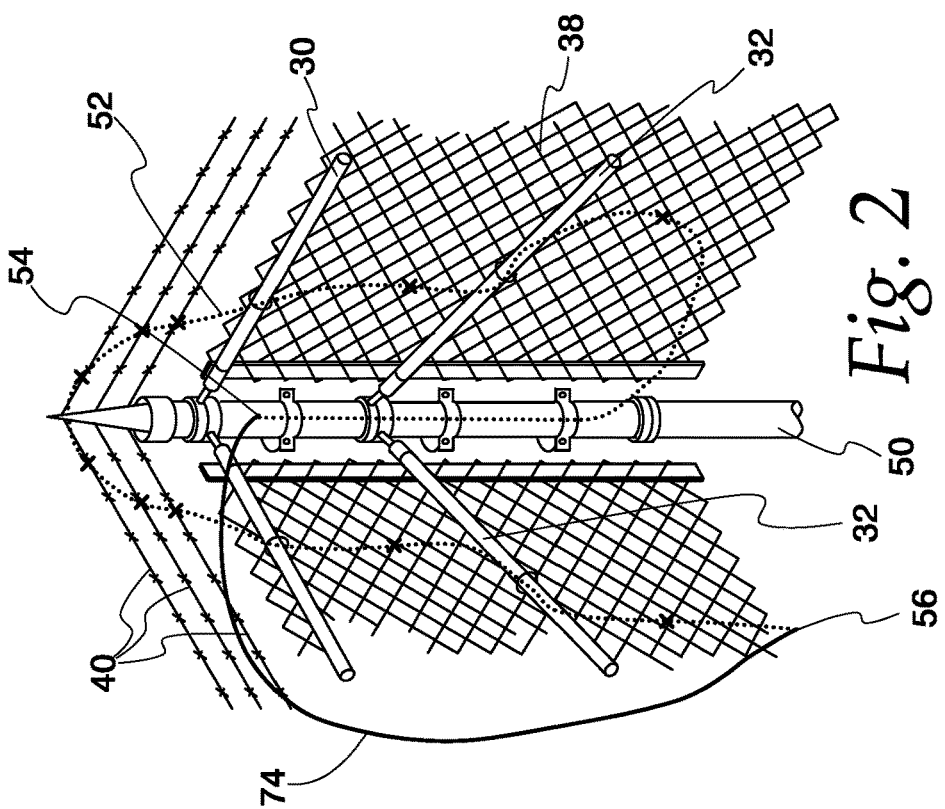

ant at numerous points along the post and other fencing structures. Thus, from top to bottom the ground conductors each engage with each barbed wire strand 40, the top rail 30, the screen section 38, the braces 32, 34 or 36, the post 16, 18 or 28, and one of the conductors of the grid 42.

FIGS. 2 and 3 illustrate a corner section of a fenced enclosure. The corner has components similar to those described above, including a corner post 50. It will be noted that the ground conductor 52 in this case has a rather circuitous path with a first end 54 starting near the top of the corner post 50. From there, the ground conductor 52 extends down the corner post 50 to a vertical brace 34, a screen section 38, a diagonal brace 32, another screen section 38, the top rail 30 and each of the barbed wire strands 40. From there, the ground conductor 52 continues to the barbed wire strands on the other side of the corner post 50 and then down through the opposite section of the corner fence. This includes the top rail 30, a fencing section 38, a diagonal brace 34, another fencing section and then into the ground where the second end 56 of the ground conductor attaches to a grid wire, as seen in FIG. 3.

The above description covers the structure of the fencing and ground conductors as intended and as initially constructed. Unfortunately, the salvage value of the ground conductors sometimes results in the structure being destroyed by thieves who cut the ground conductor near its ends and removed it from the fence or other structure. This presents a hazard to maintenance personnel who subsequently arrive at the substation expecting a grounded fence structure but instead find that it is no longer safely grounded. The present disclosure is directed to electrical circuits that will detect and report faults in the ground conductors so that it is known where ground faults exist at a facility.

SAFETY GROUND WIRE MONITORING AND ALARM SYSTEMS

CROSS REFERENCE TO RELATED APPLICATIONS

This application is a continuation of U.S. application Ser. No. 16/059,521, filed Aug. 9, 2018, which claims the benefit of and priority of U.S. Provisional Patent Application Ser. No. 62/545,205, filed Aug. 14, 2017, the contents of which are incorporated by reference herein.

FIELD OF THE DISCLOSURE

The present disclosure is directed to electrical circuits for the protection of electrical ground conductors.

BACKGROUND

Safe operation of a vast array of electrical equipment requires proper grounding of the equipment and associated structures. Proper grounding often requires a dedicated ground conductor. The ground conductor has a first portion which is electrically connected to the piece of equipment or other item to be grounded, possibly at multiple locations along the conductor. A second portion of the ground conductor is electrically grounded. Sometimes the buried end of the ground conductor is connected to further conductors, possibly forming a grid, buried in the earth. Ground conductors can be either insulated or uninsulated conductors, although frequently they are uninsulated.

In high voltage application such as power transmission not only must the electrical equipment itself be grounded but also associated structures either nearby or in contact with the equipment must also be grounded to protect against induced voltages appearing where they may not normally be expected. For example, in power transmission substations the support structures and surrounding fencing should be grounded to avert possibly dangerous conditions.

FIGS. 1-3 illustrate an example of fencing for a power transmission substation and the ground conductors therefor. FIG. 1 illustrates a gate 10 having first and second doors 12 and 14 hinged to gate posts 16 and 18, respectively. The gate posts are buried in a concrete foundation 20 which is dug into the surrounding earth 22. The gate posts join adjacent fixed sections 24 and 26 of fencing, which may have their own section posts, one of which is seen at 28. Both the gate doors and fixed sections include a top rail 30. Either or both of the gate doors and fixed sections may include one or more of diagonal braces 32, vertical braces 34 and horizontal braces 36. The posts, top rails and any braces form frames for supporting the fencing screen, e.g., chain link fencing, portions of which are shown at 38. Strands of barbed wire 40 may be located above the top rail 30. Buried in the earth beneath the concrete foundation 20 is a grid 42 of ground wire. In the illustrated example, there are five longitudinal grid wires 42A connected by lateral wires, two of which are seen at 42B. As shown, the grid 42 extends both inside and outside the gate.

When high voltage equipment is enclosed by this fence structure, the buried fence posts alone do not provide adequate grounding due to the fact that steel fence posts have too high a resistance to form an adequate ground. Thus, dedicated ground conductors are provided on and near at least some of the posts. Ground conductors are shown at 44, 46 and 48. It will be seen that each ground conductor is compressed by suitable clamps into direct physical engage-

SUMMARY

In one aspect, the present disclosure is directed to an electrical circuit for monitoring the integrity of a plurality of ground conductors. The ground conductors have first and second ends. The monitoring circuit includes a monitor box with a power supply mounted in the monitor box. The power supply has high and low voltage terminals. A separate voltage sensor is provided in the monitor box for each protected ground conductor. The voltage sensors have first and second terminals one of which is connected to the low voltage terminal of the power supply. A separate detection cable for each ground conductor extends from the monitor box to the ground conductor. Each detection cable has first and second wires therein. Each wire defines proximal and distal ends. The proximal end of the first wire is connected to the power supply's high voltage terminal. The distal end of the first wire is connected to one of the first and second ends of a ground conductor. The proximal end of the second wire is connected to the other of the first and second terminals of the voltage sensor. The distal end of the second wire is connected to the other of the first and second ends of the ground conductor. An alarm circuit responsive to the voltage sensor issues an alarm signal when the voltage sensor detects a deviation from the voltage on the power supply's high voltage terminal. The voltage sensor may include a control relay and the alarm circuit may include contacts associated with the control relay.

In another aspect, a sensor node is provided for monitoring the integrity of a ground conductor having first and second portions. The sensor node includes a power source, a first monitor wire configured to be electrically coupled to the first portion of the ground conductor, and a second monitor wire configured to be electrically coupled to the second portion of the ground conductor. The sensor node further includes a voltage sensor configured to sense the voltage on the first and second monitor wires and a wireless transmitter configured to transmit wireless signals including a "theft" signal and a "heartbeat" signal. The "theft" signal is transmitted upon the voltage sensor sensing an unexpected voltage on the first and second monitor wires and the "heartbeat" signal is periodically transmitted to confirm the continued operation of the sensor node.

In yet another aspect, a system is for monitoring the integrity of a plurality of ground conductors. The system includes a plurality of sensor nodes, with each sensor node being associated with a different one of the ground conductors and including a wireless transmitter configured to transmit wireless signals. A gateway is configured to receive wireless signals from the wireless transmitters and transmit signals including information regarding the plurality of sensor nodes. A user interface platform is configured to access and simultaneously display the information regarding at least two of the sensor nodes.

One of the advantages of the monitoring circuit of the present disclosure in that each ground conductor at a facility has its own monitoring circuit so it is possible to know which ground conductor has been compromised. Other advantages of monitoring systems according to the present disclosure will be described herein in greater detail.

BRIEF DESCRIPTION OF THE DRAWINGS

FIG. 2 is a perspective view of a corner section of a fenced enclosure looking from the inside of the enclosure, the corner section having a ground conductor and the monitoring system therefor of the present disclosure.

FIG. 3 is a perspective view of a corner section of a fenced enclosure looking from the outside of the enclosure and including a view of the perimeter of a below-grade grounding grid, the corner section having a ground conductor and the monitoring system therefor of the present disclosure.

DETAILED DESCRIPTION OF THE EMBODIMENTS

Figure 4:
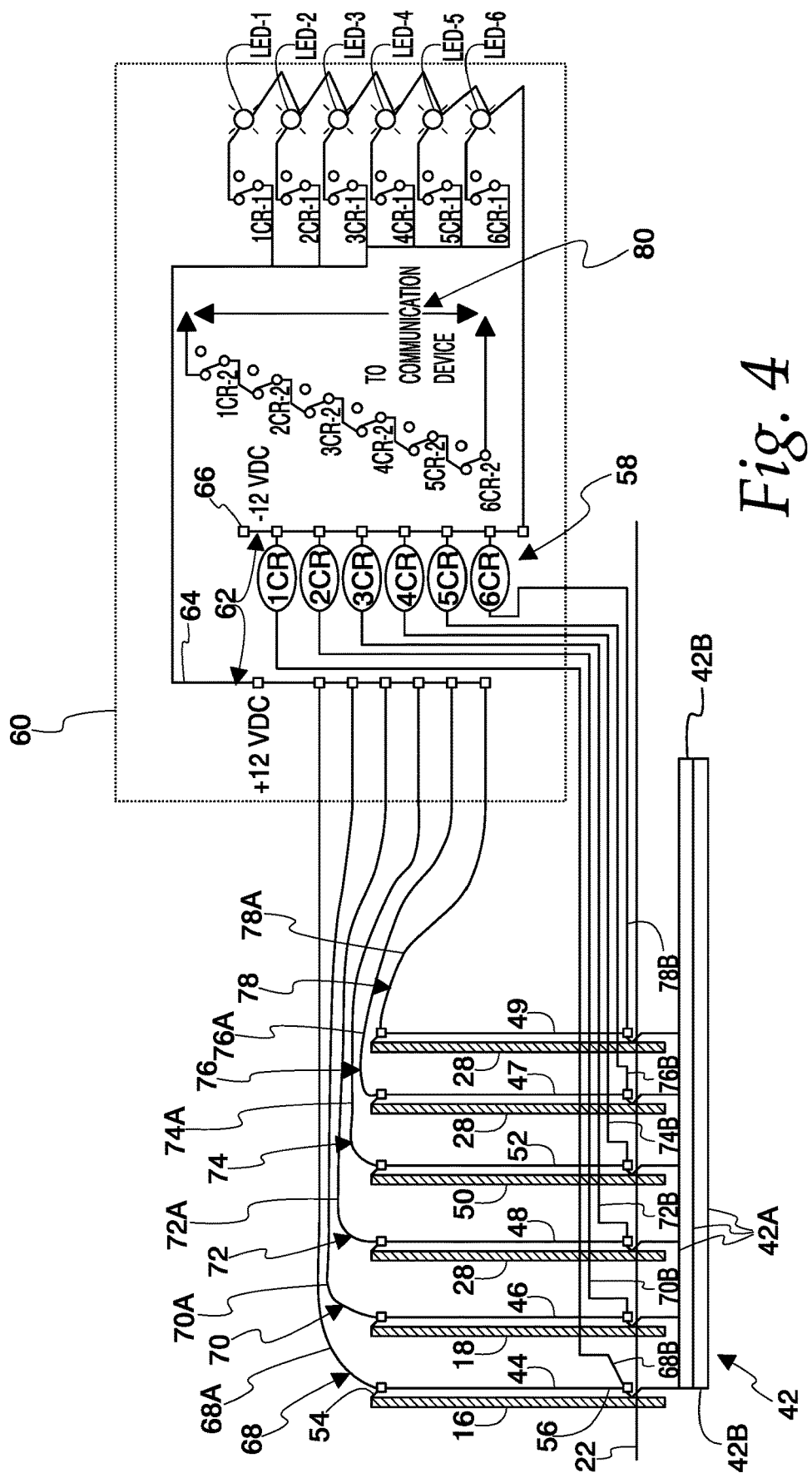
FIG. 4 is schematic illustration of the electrical circuit of one embodiment of a ground conductor monitoring system of the present disclosure for a six ground conductor system.

The present disclosure is directed to monitoring circuits for ground conductors. An electrical schematic circuit diagram for a monitoring circuit 58 of the present disclosure is shown in FIG. 4. The circuit diagram of FIG. 4 illustrates six ground conductors but it will be understood that the circuit could be employed with any number of ground conductors so long as a voltage sensor and detection cable are provided for each ground conductor. The ground conductors shown in FIG. 4 may be, for example, the gate post ground conductors 44, 46, the fixed post ground conductor 48, the corner post ground conductor 52 and two additional fixed post ground conductors 47 and 49. The ground conductors are fixed to one of their associated fence posts 16, 18, 28 or 50. As described above, the ground conductors all have a buried portion which may optionally be electrically connected to a grounding grid 42. The ground conductors also have first and second portions, preferably above ground, although one of the first and second portions could also be below ground. The first and second portions are separated from one another and are preferably at or near the ends of the ground conductor.

The monitor circuit 58 includes a monitor box shown diagrammatically in FIG. 4 at 60. Further details of the monitor box will be described below. Inside the monitor box 60 there is mounted a power supply 62. The power supply has high and low voltage terminals 64 and 66, respectively. The power supply may include a transformer (not shown) for converting a standard local AC power source to a DC source of reduced voltage, such as the +12 VDC terminal 64 and −12 VDC terminal 66 shown. It will be understood that other types of power sources could be used, such as a battery.

The monitor circuit 58 further includes a separate voltage sensor for each ground conductor. The voltage sensors are mounted in the monitor box 60. In this embodiment, the voltage sensors are control relays labeled 1CR through 6CR. Each control relay has first and second terminals. One of the terminals of the control relay is connected to the low voltage terminal 66 of the power supply 62.

A separate detection cable for each ground conductor extends from the monitor box 60 to a ground conductor. Each detection cable has first and second wires therein and each wire has proximal and distal ends. Proximal and distal are determined using the monitor box 60 as a point of reference. Thus, proximal is close to the monitor box and distal is remote from the monitor box. The proximal end of the first wire is connected to the power supply's high voltage terminal 64 and the distal end of the first wire is connected to one of the first and second portions of a ground conductor. The proximal end of the second wire is connected to the other of the first and second terminals of a control relay forming a voltage sensor. The distal end of the second wire is connected to the other of the first and second portions of the ground conductor.

Looking at FIG. 4, a specific example of the foregoing general description of the detection cables is as follows. Detection cable 68 has a first wire 68A whose proximal end is connected to the high voltage terminal 64. The distal end of first wire 68A is connected to a first portion of the ground conductor 44 at the upper end thereof. Detection cable 68 has a second wire 68B whose proximal end is connected to the control relay 1CR. The distal end of the second wire 68B is connected to a second portion of the ground conductor 44 at the lower end thereof. For convenience the connection of the distal end of second wire 68B may be to a portion of the ground conductor 44 that is just above the ground as shown, although it could be otherwise.

Each of the other ground conductors in the circuit gets its own detection cable. Thus, ground conductor 46 is connected to wires 70A and 70B of detection cable 70. Ground conductor 48 is connected to wires 72A and 72B of detection cable 72. Ground conductor 52 is connected to wires 74A and 74B of detection cable 74. Ground conductor 47 is connected to wires 76A and 76B of detection cable 76, and ground conductor 49 is connected to wires 78A and 78B of detection cable 78. Similarly, the proximal ends of the second wires 70B, 72B, 74B, 76B and 78B are connected to control relays 2CR, 3CR, 4CR, 5CR and 6CR, respectively. The terminal of each control relay not connected to the detection cable's second wire is connected to the low voltage terminal 66 of the power supply 62.

Also connected to the low voltage terminal 66 of the power supply is an alarm circuit for each ground conductor that is responsive to a voltage sensor for issuing an alarm signal when the voltage sensor detects a deviation from the voltage on the power supply's high voltage terminal 64. Specifically, there is a set of normally-open control relay contacts for each control relay. For example, control relay 1CR has contacts 1CR-1 and 1CR-2. Control relay 2CR has contacts 2CR-1 and 2CR-2, and so on for the remaining control relays. Each of the contacts with the XCR-1 label has one side connected to the high voltage terminal 64 and the other side connected in series with an LED, labeled LED-1 through LED-6, respectively. The other side of the LED's are connected to the low voltage terminal 66.

Each of the contacts with the XCR-2 label is connected in series with one another between the terminals of a communications device indicated schematically at 80. The communications device 80 is preferably mounted in the monitor box 60. The communications device 80 could be any kind of desired alarm signal, either visual, audible, electronic or otherwise, or some combination of these. The communications device could send, for example, a text message, an e-mail or a voice mail. A preferred communications device is a wireless device such as a cellular phone or the like for communicating to a base station the fact that a fault condition has occurred. Personnel so alerted will arrive at the scene and examine the monitor box to see which LED is unlit, thereby indicating which ground conductor has been compromised.

Figure 5:
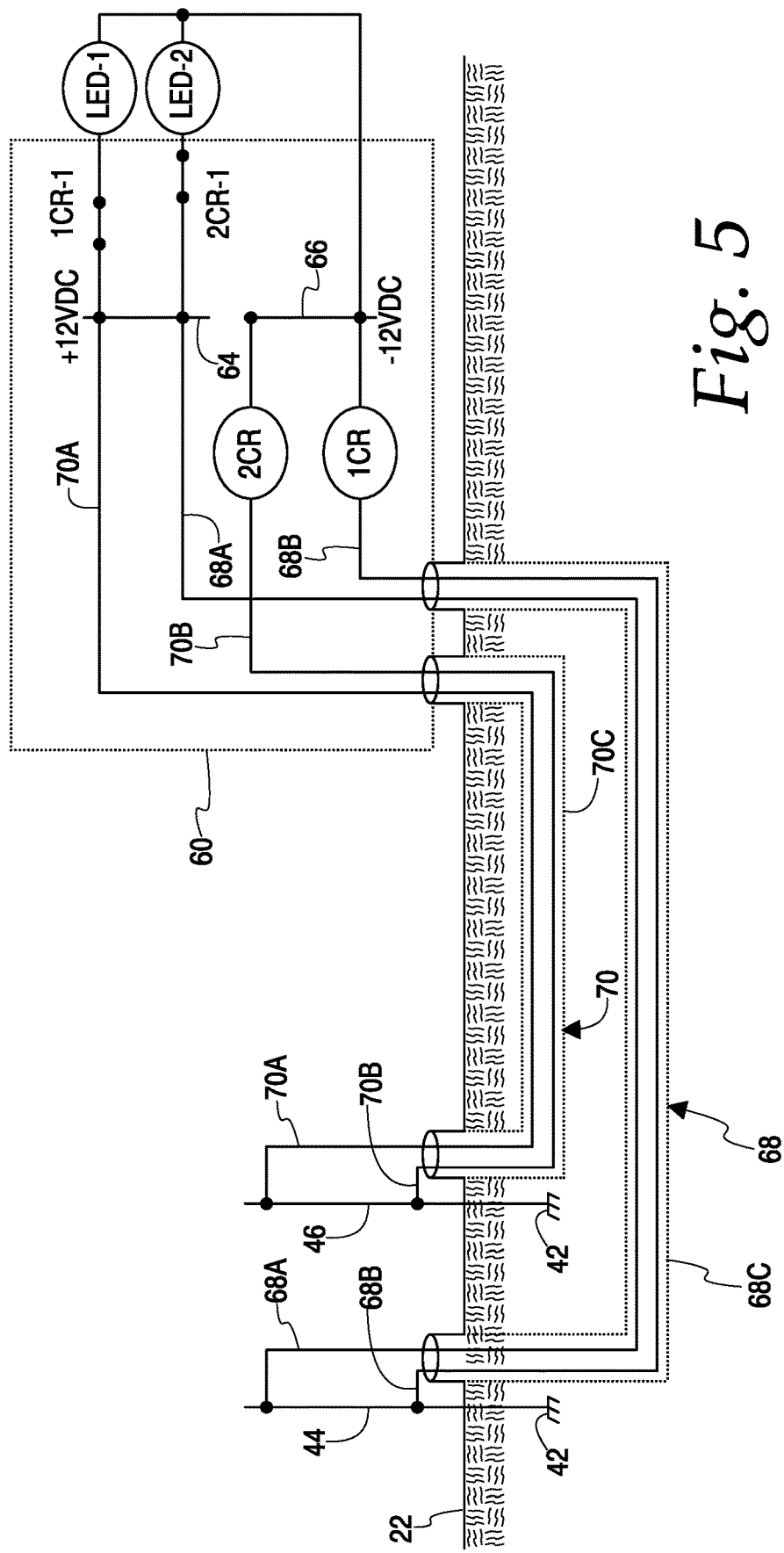
FIG. 5 is schematic illustration of one embodiment of a physical layout of a portion of the circuit of FIG. 4, showing two ground conductors.

The electrical schematic of FIG. 4 may give the impression that the wires of a detection cable are physically separated for most of their length. While this could be done, a more efficient physical arrangement for the detection cables is illustrated in FIG. 5. This diagram illustrates only two ground conductors 44 and 46 and their associated detection cables 68 and 70. It will be understood that the arrangement would be similar for all ground conductors regardless of the number of ground conductors present. In this circuit diagram, electrical conductors are indicated with solid lines and mechanical structures are shown in dotted lines. The earth level 22 is shown with hatching. The detection cable 68 has an outer insulation jacket 68C, much of which is buried underground. It only comes above ground at one end in the vicinity of the monitor box 60 and at the other end in the vicinity of the ground conductor 44. At the ground conductor 44 the first and second wires 68A and 68B are separated for connection to opposite portions or ends of the ground conductor. Similarly, at the monitor box 60 wires 68A and 68B are separated from one another for individual connection to the high voltage terminal 64 and control relay 1CR. Elsewhere the wires 68A and 68B are contained together within outer jacket 68C. The same arrangement applies to all the other detection cables, that is, the wires are separated within the monitor box and at the ground conductor but otherwise are contained within the outer insulation jacket of the cable.

Figure 6:
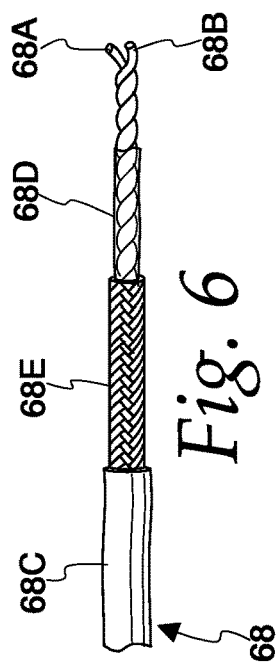
FIG. 6 is an elevation view of a detection cable, with portions stripped away to show the internal structure of the cable.

By way of example and not by limitation, a suitable detection cable is shown in FIG. 6 at 68 and has the following specifications.

Rating: outdoor, direct burial, cULus recognized AWM, 600 volt.

Conductors (shown at 68A and 68B): copper, #18 AWG through #10 AWG, stranding per ASTM B-174 and Underwriters' Laboratory minimum circular mil area.

Conductors 68A, 68B have primary & secondary insulation as follows: primary insulation—#18 & #16 AWG TFFN, #14 & larger AWG THHN; secondary insulation—0.005" wall nominal clear nylon.

Conductor color code: red and black.

Outer jacket (shown at 68C): chlorinated polyethylene or polychloroprene black outdoor and direct burial rated.

Core protective layer (shown at 68D): 0.001" thick Mylar® wrap 25% overlap.

Cable electrical interference barrier (shown at 68E): 85% coverage #36 AWG tinned copper shielding braid.

Figure 7:
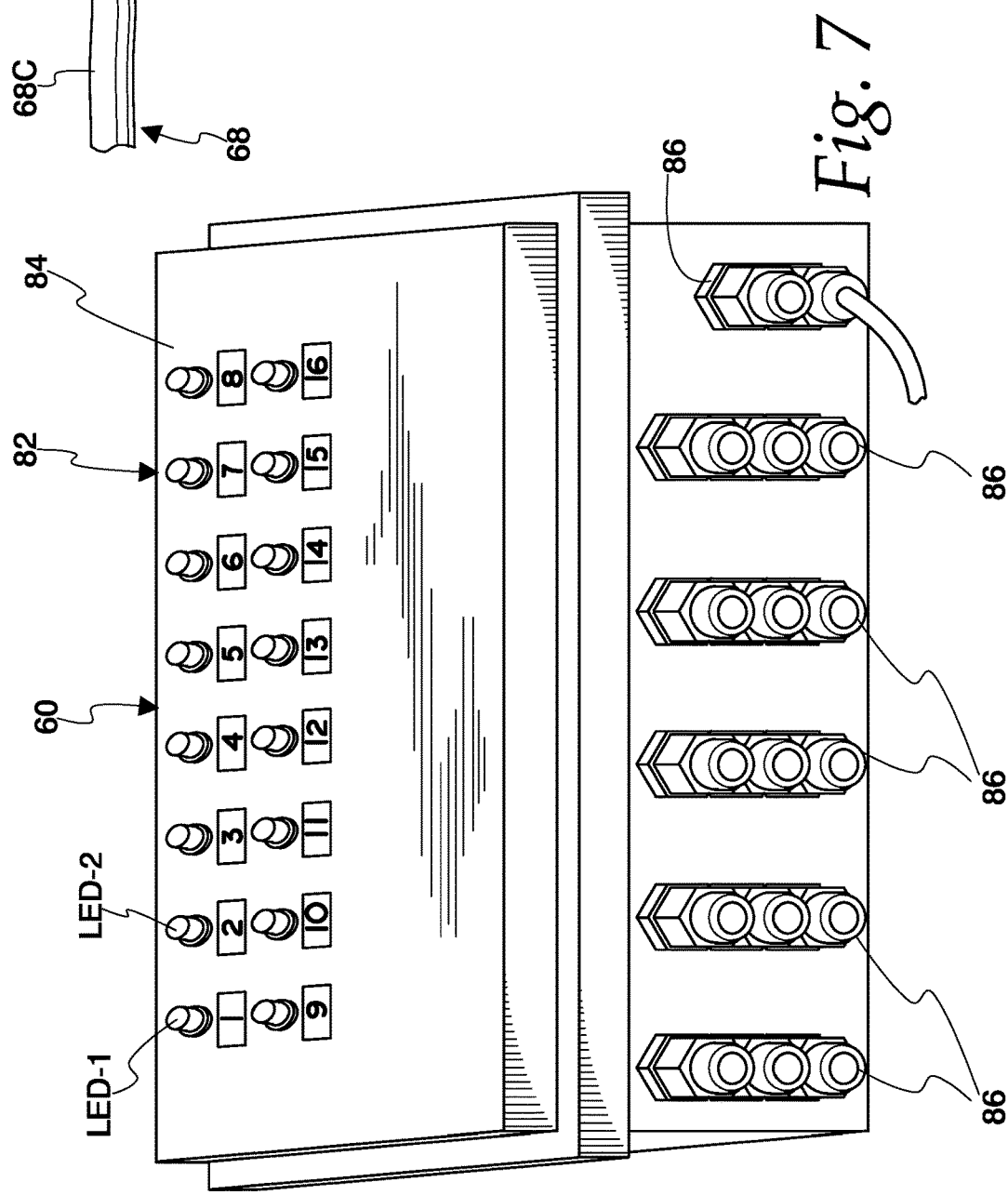
FIG. 7 is a perspective view of the monitor box for a sixteen ground conductor system, showing the cover closed and the LED's on the exterior of the cover.
Figure 8:
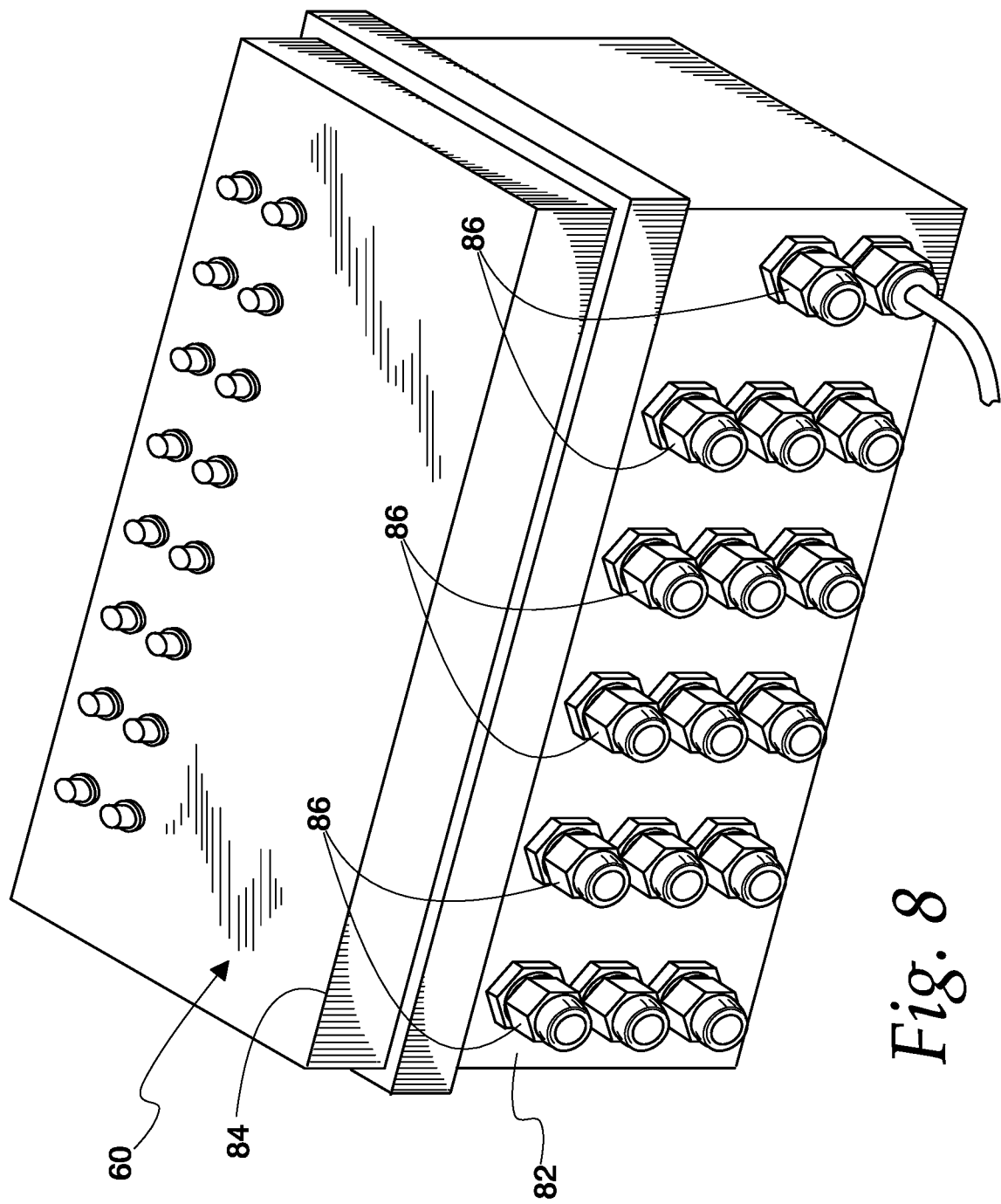
FIG. 8 is a perspective view from another angle of the monitor box of FIG. 6.
Figure 9:
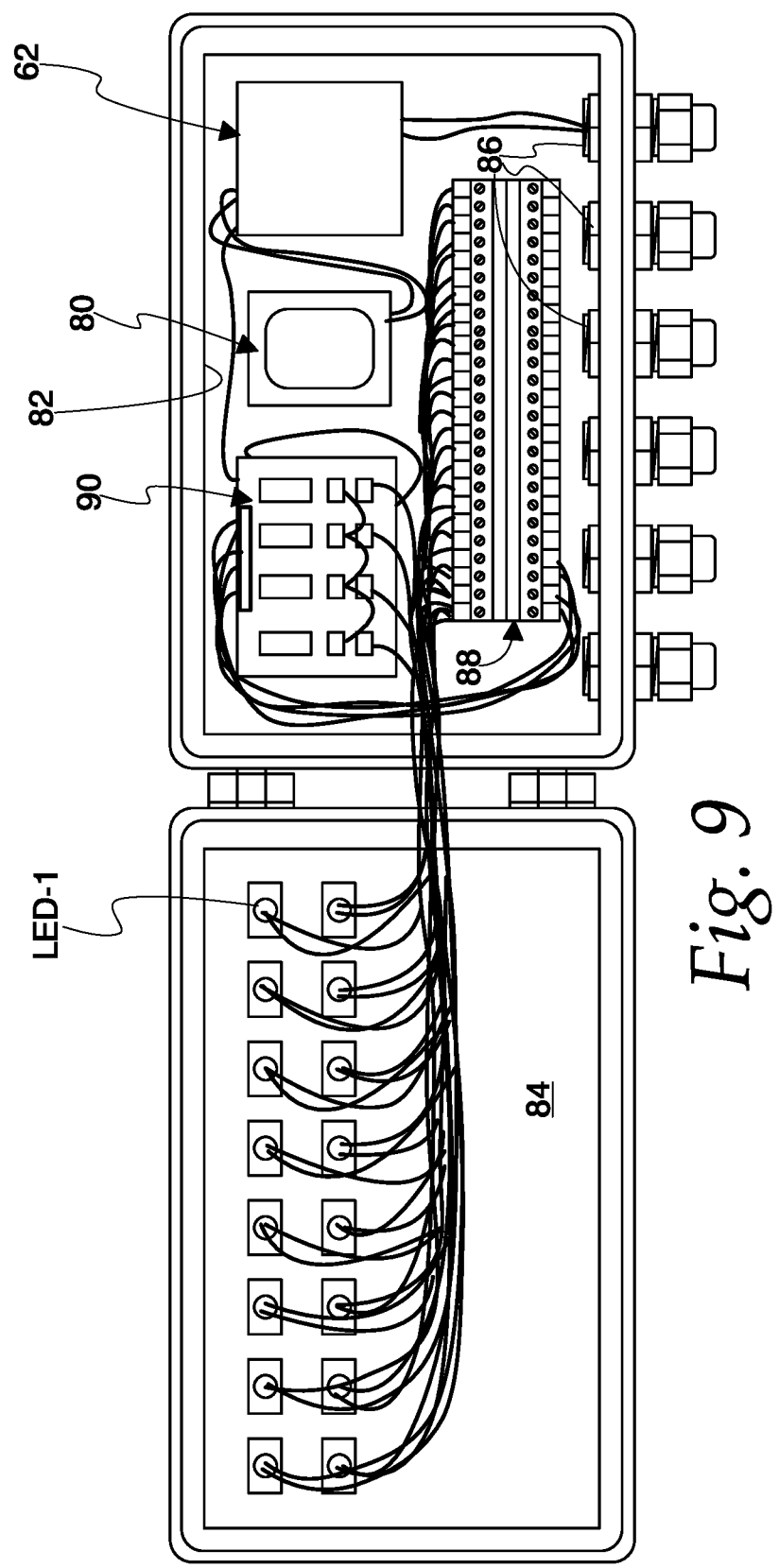
FIG. 9 is a front elevation view of the monitor box of FIG. 6, with the cover open to reveal the circuit elements inside the box.

FIGS. 7-9 illustrate the monitor box 60. It includes a five-sided housing 82 with a sixth side that can be opened (as in FIG. 9) or closed by a hinged door or cover 84. The bottom of the housing has a plurality of openings which receive strain relief fittings 86 for receiving the detection cables and a power cable (the cables themselves are not shown here). The interior of the monitor box 60 is seen in FIG. 8. The power supply 62 is mounted in the housing and has its high and low voltage terminals connected to a terminal block 88. The terminal block 88 is mounted in the interior of the housing 82 for receiving the proximal ends of the detection cables, as well as the high and low voltage terminals of the power supply 62. A set of control relays 90 forming the relays 1CR through 16CR and their associated contacts is mounted in the housing 82, with connections to the terminal block 88. The communications device is shown at 80. The LED's are mounted in the cover 84 as shown in FIGS. 6 and 8.

The use, operation and function of the circuit are as follows. When the power supply is activated and all connection are made and intact, the control relays are activated through a circuit including the first wire of the detection cable, the ground conductor, the second wire of the detection cable and the control relay itself. Activation of the control relay closes the associated contacts, closing the circuits to activate the LED's. The detection circuit is also closed which deactivates the alarm device. If and when a ground conductor is compromised, the circuit to its control relay is broken. This opens the relay contacts with two results. First, the LED for that ground conductor shuts off. Second, the communications device is activated by the open circuit that it sees. This sends a signal to an appropriate base station indicating something is not normal. Personnel arriving to investigate can look at the control panel door and determine which ground conductors are missing by seeing which LED's are not lit.

Among the advantages of this monitoring system are that it identifies precisely which individual ground conductors are compromised and it does so at relatively low cost. A single monitor box, power supply and communications device can be used with any number of ground conductors.

Figure 1:
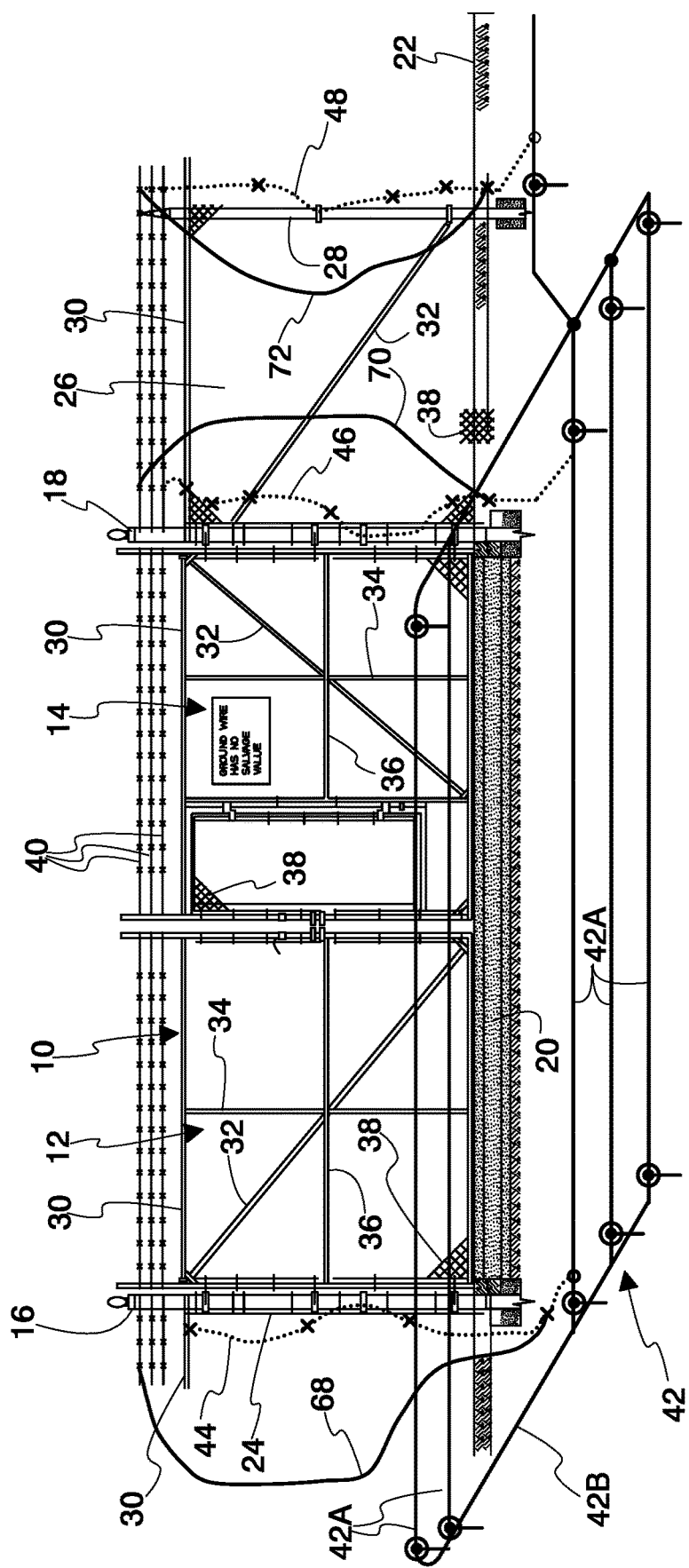
FIG. 1 is a perspective view of a fence gate and a below-grade grounding grid, the fence gate having ground conductors and the monitoring system therefor of the present disclosure.
Figure 10:
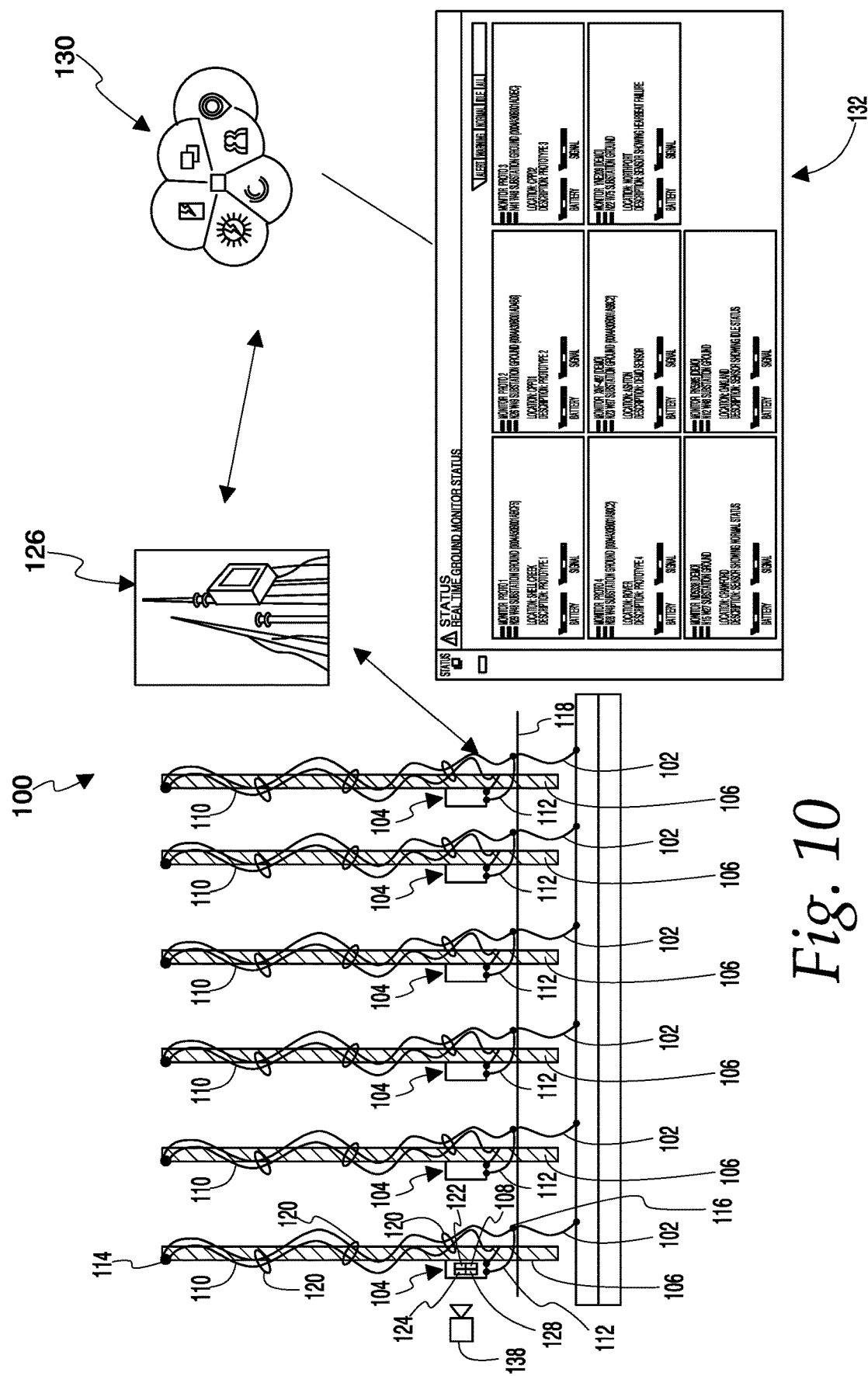
FIG. 10 is a schematic illustration of an alternative embodiment of a ground conductor monitoring system of the present disclosure.

FIG. 10 illustrates an alternative embodiment of a ground conductor monitoring system 100 that may be used in combination with a grounding system of the type shown in FIGS. 1-3. In the embodiment of FIG. 10, each ground conductor 102 is provided with an associated sensor node 104. FIG. 10 illustrates six ground conductors 102 and six sensor nodes 104, with each sensor node 104 being either substantially identical (which may be preferred) or at least two of the sensor nodes 104 being differently configured. The sensor nodes 104 are shown as being installed at a lower portion of the fence 106, adjacent to the associated ground conductor 102, but it is also within the scope of the present disclosure for a sensor node 104 to be positioned at a different location (e.g., at a higher portion of the fence 106 and/or spaced from the associated ground conductor 102). Preferably, the sensor nodes 104 are durably built and weather-resistant (e.g., by being enclosed in a water- and shock-resistant housing) to withstand the environmental conditions in which the sensor nodes 104 are to be operated.

Each sensor node 104 includes a power source 108 (which may be configured as an industrial lithium battery in one embodiment) and a pair of monitor or sensor wires 110 and 112. The power source 108 and monitor wires 110 and 112 are components of a closed circuit, with the monitor wires 110 and 112 being electrically coupled to the associated ground conductor 102 (e.g., using split bolts) at different locations or portions of the ground conductor 102, which are illustrated at 114 (for the upper or first monitor wire 110) and 116 (for the lower or second monitor wire 112). Preferably, one of the monitor wires 110 is electrically connected or associated to the associated ground conductor 102 at or adjacent to an upper end or portion of the ground conductor 102, while the other monitor wire 112 is electrically connected or associated to the associated ground conductor 102 at or adjacent to a lower end or portion of the ground conductor 102 (which may be either above the earth 118 or below grade). If one of the monitor wires 110, 112 is especially elongated (as is the case of the upper monitor wire 110 of FIG. 10), it may be advantageous for it to be physically connected to the associated ground conductor 102 at one or more locations along its length, as shown at 120.

One of the monitor wires 110, 112 of each pair is coupled to a high voltage terminal of the power source 108 of the associated sensor node 104, while the other monitor wire 110, 112 is coupled to a low voltage terminal of the power source 108. The sensor node 104 includes a voltage sensor 122 that is configured to monitor or sense the voltage on the monitor wires 110 and 112, which is the basis for a "theft" or "open circuit" alert or signal being generated by a communications device or wireless transmitter 124 of the sensor node 104 in the event of a deviation from the expected voltage, which is most notably when one or both of the monitor wires 110 and 112 is cut or otherwise damaged or compromised in connection with attempted theft of the associated ground conductor 102 (as described above with respect to the system of FIGS. 4 and 5).

In contrast to the system of FIGS. 4 and 5, the signal generated upon detection of an unexpected voltage on the monitor wires 110 and 112 (along with any other signals transmitted from or to the sensor nodes 104) is wirelessly transmitted to a gateway or receiver 126. The exact nature of the wireless signal may vary without departing from the scope of the present disclosure. In one embodiment, the wireless transmitters 124 of the sensor nodes 104 may be configured to communicate with the gateway via LoRaWAN (long range wide area network) protocol, which may be advantageous to the extent that LoRaWAN protocol supports relatively small data packets, thereby increasing the life of the power source 108 of the sensor node 104. Battery life may be further increased by reducing the amount of bi-directional communication between the sensor nodes 104 and the gateway 126, such as by allowing the gateway 126 to only receive signals from the sensor nodes 104 without transmitting signals to the sensor nodes 104 or allowing only selected transmissions from the gateway 126 to the sensor nodes 104 (e.g., to reconfigure or turn on/off one or more sensor nodes 104). If the sensor node 104 is configured to receive communications, its wireless transmitter 124 may be configured as a transmitter/receiver and/or the sensor node 104 may be provided with a separate wireless receiver. By way of example, if the power source 108 of a sensor node 104 is provided as an industrial lithium battery, the battery life may be on the order of ten years when signals are sent via LoRaWAN protocol. Battery life may be further extended by placing the sensor nodes 104 into an inactive or idle or "sleep" mode (in which the circuit including the monitor wires 110 and 112 is open) prior to installation and/or activation (during which time the circuit is closed).

Wireless communication via LoRaWAN protocol allows for the gateway 126 (which single gateway 126 may receive signals from all of the sensor nodes 104 in its range) to be positioned up to approximately five miles or eight kilometers or farther from the substation. LoRaWAN protocol also allows for a large number of sensor nodes 104 (e.g., on the order of 10,000 or more) to communicate with a single gateway 126. Other forms of wireless communication (any of which may be employed) may allow for greater or lesser range, along with other differences in operational parameters, such as the size of data packets, the need for line of sight between the sensor nodes 104 and the gateway 126, etc. It is contemplated that the proper wireless communication protocol may be selected given the particular characteristics of each installation (e.g., the nature of the terrain surrounding the substation, whether there are a plurality of large building or other tall obstacles in the vicinity of the gateway 126, etc.).

Regardless of the particular protocol by which the sensor nodes 104 communicate with the gateway 126, the sensor nodes 104 may send a variety of data to the gateway 126. For example, in addition to a "theft" signal, each sensor node 104 may periodically (e.g., every thirty minutes) send a "heartbeat" signal to the gateway 126 to verify that the sensor node 104 is still functioning. By providing only a periodic "heartbeat" signal to the gateway 126, rather than constantly transmitting a signal to the gateway 126, the battery life of the sensor nodes 104 may be prolonged. If the gateway 126 does not receive an expected "heartbeat" signal from a sensor node 104, the gateway 126 may interpret it as a sign that the sensor node 104 has become inoperative for any one of a variety of reasons (e.g., low battery, damage incurred during theft of an associated ground conductor 102, etc.).

This "heartbeat" signal may include (or the gateway 126 may derive from the "heartbeat" signal) information regarding the life of the power source 108 of the sensor node 104, the strength of the signal received by the gateway 126, and the identity of the sensor node 104. In one embodiment, the sensor node 104 may have GPS (global positioning system) capabilities, in which case the "heartbeat" signal may include the GPS coordinates of the sensor node 104. Other identifying information may include a unique serial number or some other unique identifier that distinguishes each sensor node 104 from any other sensor node 104 in the range of the gateway 126. However, GPS coordinates may be especially advantageous for a number of reasons, including in the event that a sensor node 104 is moved from one ground conductor 102 to another, as the GPS coordinates will automatically be updated to reflect the change in association and location of the sensor node 104.

In one embodiment, the sensor nodes 104 are each provided with a motion sensor 128. In such an embodiment, a sensor node 104 may transmit a "movement" signal to the gateway 126 in the event that the sensor node 104 is subject to movement above a certain threshold amount. Theft of the ground conductor 102 associated with a sensor node 104 will invariably cause movement of the fence 106 in the vicinity of the sensor node 104, such that movement of the sensor node 104 may be indicative of an attempted theft of the ground conductor 102. Thus, a "movement" signal, when paired with a concurrent "theft" signal, may be a better indication that a ground conductor 102 has been compromised than a "theft" signal alone. Additionally, the motion sensor 128 may be considered to act in concert with the wireless transmitter 124 to provide a backup or auxiliary "theft" alarm, in the event that there is some malfunction in the ability of the wireless transmitter 124 to transmit a "theft" alarm when appropriate.

The degree of movement of the sensor node 104 that is allowed before a "movement" signal is generated may be selected by an operator or system administrator. For example, if it is found that a particular sensor node 104 is generating false alarms (e.g., because it is associated with a portion of the fence 106 that is subject to regular animal intrusion), an operator or system administrator may increase the threshold of movement that is required before a "movement" signal is transmitted from the sensor node 104 to the gateway 126 in order to reduce or eliminate the false alarms. If the sensor node 104 is GPS-enabled, the weather in the vicinity of the sensor node 104 may be determined, which may also be consulted in assessing the reason for a false alarm (e.g., if there are high winds in the area causing excessive movement of the fence 106).

The various signals received by the gateway 126 are passed along to an operator for analysis and response. According to one embodiment, upon receiving a signal, the gateway 126 transmits a separate signal (which may be transmitted via a wired connection, such as Ethernet, or a wireless connection, such as a cellular connection) to a cloud storage facility 130, which may be accessed via a user interface platform 132 located in a security operation center, for example. The user interface platform 132 may be a desktop or laptop or tablet computer or a smartphone or the like (including being accessible via a plurality of differently configured devices), which allows an operator to retrieve data from the sensor nodes 104 (via the gateway 126 and the cloud storage facility 130) and, optionally, issue commands to the sensor nodes 104 (via the gateway 126).

If the cloud storage facility 130 and the user interface platform 132 are configured to be used in combination with a plurality of gateways 126, the signals from each gateway 126 to the cloud storage facility 130 may include some identifying information regarding the gateway 126. For example, if a gateway 126 is GPS-enabled, then the signal from the gateway 126 to the cloud storage facility 130 may include the GPS coordinates of the gateway 126, to distinguish it from any other gateway 126 from which the cloud storage facility 130 may receive data. Other identifying information (e.g., a unique serial number or the like) may alternatively or additionally be appended to each signal to identify the gateway 126 from which a signal is being transmitted.

Figure 11:
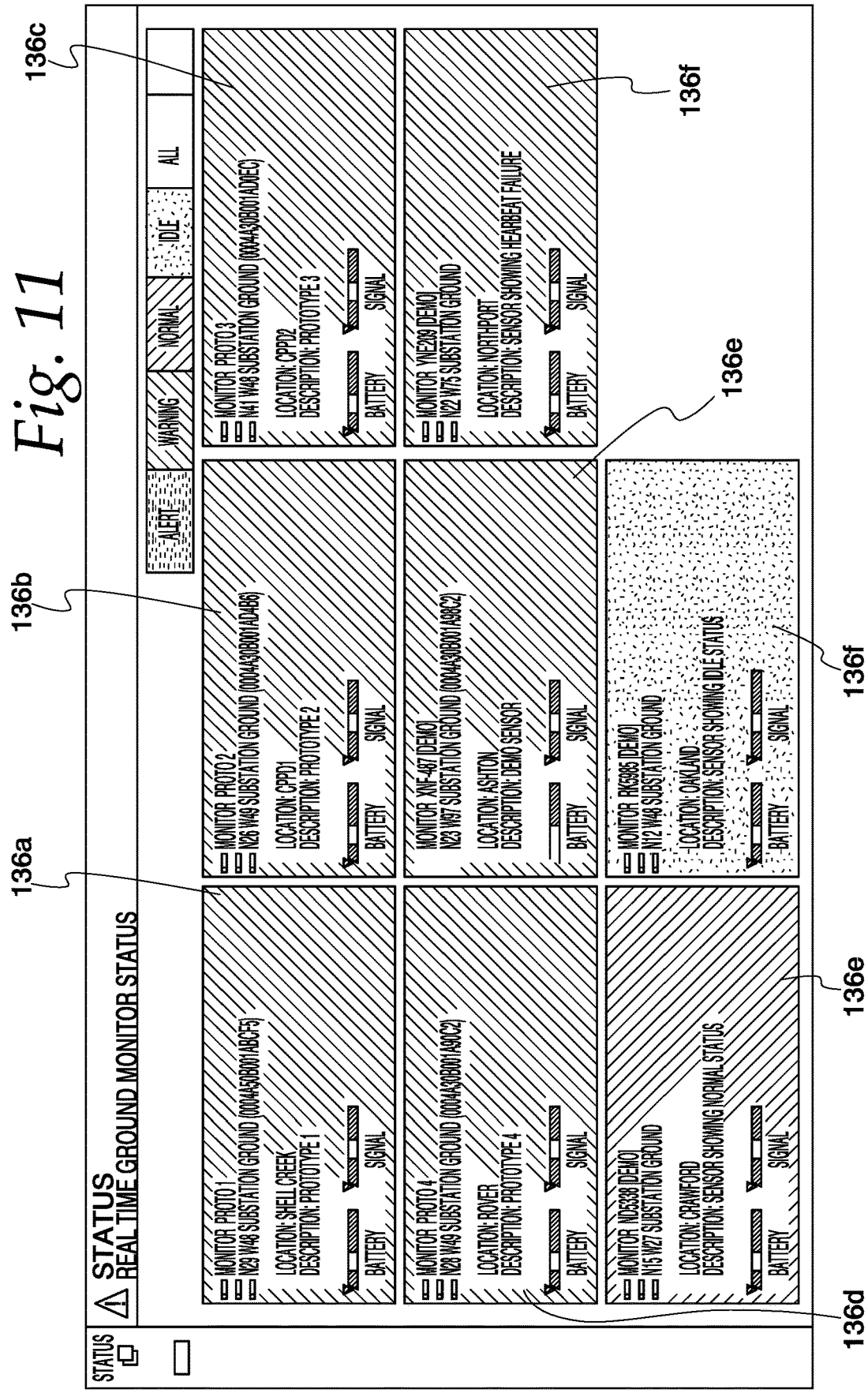
FIG. 11 illustrates a screen of a user interface platform of the ground conductor monitoring system of FIG. 10.

FIG. 11 illustrates an exemplary screen 134 of the user interface platform 132 in greater detail. The particular appearance of the illustrated screen 134 is dictated by a computer program (e.g., a software program) and may vary without departing from the scope of the present disclosure. In the embodiment of FIG. 11, there are eight cells 136a-136h (collectively referred to herein as 136), each of which corresponds to a different sensor node 104. Thus, a plurality of sensor nodes 104 (which may include all of the sensor nodes 104 to be monitored by an operator or whose information has been transmitted to the cloud storage facility 130 or some lesser number of sensor nodes 104, including only one or two of the sensor nodes 104) may be simultaneously displayed on the screen 134 and considered by the operator.

In the illustrated embodiment, each cell 136 displays a variety of information regarding an associated sensor node 104. For example, each cell 134 may display identifying information (location, description, and GPS coordinates, in the illustrated embodiment) to distinguish the subject sensor node 104 from any other sensor node 104. Each sensor node 104 may be customized with a name or identifier by an operator to provide identifying information that may be more user-friendly than a GPS location or serial number. Each illustrated cell 136 also includes a battery life gauge and a signal strength gauge, which show the life of the battery of the subject sensor node 104 and the strength of the signal from the subject sensor node 104 to the gateway 126, respectively. Other information (e.g., weather data, if the sensor nodes 104 are GPS-enabled) may also be displayed in each cell 136. It is contemplated that the type of information shown in each cell 136 and the location of that information within each cell 136 may be customized by an operator.

The cells 136 may be color-coded or otherwise subject to some change in their appearance to indicate a status of the subject sensor node 104. For example, in one embodiment, the background of a cell 136 may be colored blue to indicate that the subject sensor node 104 is idle (e.g., if it has not yet been installed and/or activated). If the subject sensor node 104 is operating normally, its background may be colored green, for example. If the associated sensor node 104 is subject to a "warning" condition in which it is not operating normally (e.g., if the battery life and/or signal strength are low or if the gateway 126 does not receive an expected "heartbeat" signal from the sensor node 104), the background of the cell 136 may be colored orange, for example. Finally, if the associated sensor node 104 is subject to an "alert" condition (e.g., as the result of a "theft" and/or "movement" signal), the background of the cell 136 may be red, for example. When a sensor node 104 is subject to an "alert" condition, the associated cell 136 may display whether the gateway 126 received only one of the "movement" signal and the "theft" signal or both of the "movement" and "theft" signals, which gives an operator a better idea as to whether the integrity of the ground conductor 102 associated with the sensor node 104 has indeed been compromised.

In one embodiment, each sensor node 104 may be associated with a video monitor 138 (e.g., a camera), which may be accessed via the user interface platform 132. For example, if a cell 136 indicates an "alert" condition, an operator may manipulate the user interface platform 132 to view the sensor node 104 and associated ground conductor 102 via the associated video monitor 138 to assess the cause of the "alert" condition before an in-person inspection of the substation. To facilitate an in-person inspection, should one be warranted after viewing the footage from the video monitor 138, the user interface platform 132 may be configured to allow for a map feature to be accessed, which calls up a map showing the location of the subject sensor node 104.

The user interface platform 132 may also provide a means by which an operator may configure the sensor nodes 104. For example, the operator may be given the ability to modify the operation of one or more sensor nodes 104 (e.g., enabling or disabling GPS functionality, setting parameters for "alert" conditions, turning the sensor nodes 104 on/off, etc.) using the user interface platform 132.

In addition to alert conditions being viewable via the user interface platform 132, they may also be reported via other means. For example, an alert condition may be reported to an operator (from the user interface platform 132 or from the gateway 126 or, depending on their configuration, directly from a sensor node 104) via text message, telephone call, and/or e-mail.

It should be understood that the user interface platform 132 is not limited to use with the system 100 of FIG. 10, but may also be employed with other ground conductor monitoring systems, including the system of FIGS. 4 and 5.

It should also be understood that various changes and modifications to the presently preferred embodiments described herein will be apparent to those skilled in the art. Such changes and modification can be made without departing from the spirit and scope of the invention disclosed herein.

The invention claimed is:

1. A system for monitoring the integrity of a plurality of ground conductors, the system comprising:
   an item to be grounded;
   a plurality of ground conductors each having a first portion electrically coupled to the item to be grounded and a second portion that is grounded;
   a plurality of sensor nodes, wherein each sensor node is associated with a different one of the plurality of ground conductors and includes a wireless transmitter configured to transmit wireless signals;
   a gateway configured to receive wireless signals from the wireless transmitters and transmit signals including information regarding the plurality of sensor nodes; and
   a user interface platform configured to access and simultaneously display the information regarding at least two of the plurality of sensor nodes on a single display device, wherein
     all of said plurality of sensor nodes are substantially identical,
     the user interface platform is configured to simultaneously display the same type of information for said at least two of the plurality of sensor nodes, and
     said same type of information comprises at least two of a battery life, a signal strength, and a status selected from a plurality of statuses.

2. The system of claim 1, wherein the user interface platform is configured to simultaneously display information regarding all of the plurality of sensor nodes.

3. The system of claim 1, wherein the wireless signals transmitted by the wireless transmitters include GPS coordinates and the user interface platform is configured to display weather information regarding said at least two of the plurality of sensor nodes based at least in part on said GPS coordinates.

4. The system of claim 1, wherein
   the user interface platform is configured to simultaneously display at least two cells, and
   the information regarding each one of said at least two of the plurality of sensor nodes is displayed in a different one of said at least two cells.

5. The system of claim 1, wherein
   the user interface platform is configured to allow an operator to modify the operation of one or more of said at least two of the plurality of sensor nodes, and
   the gateway is configured to transmit a wireless signal to said one or more of said at least two of the plurality of sensor nodes so as to modify the operation of said one or more of said at least two of the plurality of sensor nodes as instructed by the operator.

6. The system of claim 5, wherein
   each one of said plurality of sensor nodes includes a motion sensor,
   each wireless transmitter is configured to transmit a "movement" signal to the gateway upon the motion sensor of the associated sensor node sensing movement above a threshold amount, and
   the user interface platform is configured to allow an operator to modify the threshold amount.

7. The system of claim 1, wherein
   each wireless transmitter is configured to transmit a "theft" signal to the gateway upon the associated sensor node detecting possible compromise of the integrity of the associated ground conductor,
   the user interface platform is configured to display an "alert" condition based at least in part on the "theft" signal, and
   at least one of the gateway, the user interface platform, and the plurality of sensor nodes is configured to alert an operator of the "alert" condition via text message, telephone call, and/or e-mail.

8. The system of claim 1, wherein the wireless transmitters are configured to transmit wireless signals via LoRaWAN protocol.

9. The system of claim 1, wherein
   each wireless transmitter is configured to periodically transmit "heartbeat" signals to the gateway to confirm the continued operation of the associated sensor node,
   the gateway and/or the user interface platform is configured to determine the absence of an expected "heartbeat" signal, and
   the user interface platform is configured to, upon it being determined that the wireless transmitter of said associated sensor node has failed to transmit the expected "heartbeat" signal, display a "warning" status indicating that the associated sensor node is not operating normally.

10. The system of claim 1, wherein the gateway is configured to transmit said signals including information regarding the plurality of sensor nodes to a cloud storage facility accessible by the user interface platform.

11. The system of claim 1, wherein the wireless signals transmitted by the wireless transmitters include GPS coordinates and the user interface platform is configured allow for an operator to cause a map showing the location of one or more of said at least two of the plurality of sensor nodes to be displayed by the user interface platform.

12. The system of claim 1, further comprising a video monitor associated with one of said at least two of the plurality of sensor nodes, wherein the user interface platform is configured to allow an operator to selectively cause footage from the video monitor to be displayed by the user interface platform.

13. The system of claim 1, wherein
each one of said plurality of sensor nodes includes a motion sensor and a voltage sensor,
each wireless transmitter is configured to transmit a "movement" signal to the gateway upon the motion sensor of the associated sensor node sensing movement above a threshold amount,
each wireless transmitter is configured to transmit a "theft" signal to the gateway upon the voltage sensor of the associated sensor node sensing an unexpected voltage, and
the user interface platform is configured to display an "alert" condition indicative of possible compromise of the integrity of the ground conductor associated with the associated sensor node upon the gateway receiving at least one the "movement" signal and the "theft" signal.

14. The system of claim 13, wherein the user interface platform is configured to display, as part of the "alert" condition, whether the gateway received only one of the "movement" signal and the "theft" signal for the associated sensor node or both the "movement" signal and the "theft" signal for the associated sensor node.

15. A system for monitoring the integrity of a ground conductor, the system comprising:
an item to be grounded;
a ground conductor having a first portion electrically coupled to the item to be grounded and a second portion that is grounded; and
a sensor node comprising
a battery;
a first monitor wire electrically coupled to the first portion of the ground conductor;
a second monitor wire electrically coupled to the second portion of the ground conductor;
a voltage sensor configured to sense the voltage on the first and second monitor wires; and
a wireless transmitter configured to transmit wireless signals including a "theft" signal and a "heartbeat" signal, wherein the "theft" signal is transmitted upon the voltage sensor sensing an unexpected voltage on the first and second monitor wires and the "heartbeat" signal is periodically transmitted to confirm the continued operation of the sensor node and includes information regarding the battery and the identity of the sensor node.

16. The system of claim 15, wherein the wireless transmitter is configured to transmit wireless signals via LoRaWAN protocol.

17. The system of claim 15, wherein the wireless signals transmitted by the wireless transmitter include GPS coordinates.

18. The system of claim 15, wherein the wireless transmitter is configured to receive wireless signals and/or the sensor node includes a wireless receiver that is separate from the wireless transmitter.

19. The system of claim 15, further comprising a motion sensor, wherein the wireless transmitter is configured to transmit a "movement" signal upon the motion sensor sensing movement above a threshold amount.

20. The system of claim 15, wherein the sensor node is configured to be in a "sleep" mode in which a circuit including the first and second monitor wires is open prior to association of the sensor node to the ground conductor.

* * * * *